(12) United States Patent
Meersman et al.

(10) Patent No.: US 10,114,601 B2
(45) Date of Patent: Oct. 30, 2018

(54) TILED DISPLAY, AND DISPLAY TILE AND CARRIER SUBSTRATE FOR USE IN SAME

(71) Applicant: BARCO N.V., Kortrijk (BE)

(72) Inventors: Karim Meersman, Kortemark (BE); Greet Adams, Deerlijk (BE)

(73) Assignee: BARCO N.V., Kortrijk (BE)

( * ) Notice: Subject to any disclaimer, the term of this patent is extended or adjusted under 35 U.S.C. 154(b) by 0 days.

(21) Appl. No.: 15/537,251

(22) PCT Filed: Jan. 5, 2016

(86) PCT No.: PCT/EP2016/050064
§ 371 (c)(1),
(2) Date: Jun. 16, 2017

(87) PCT Pub. No.: WO2016/110483
PCT Pub. Date: Jul. 14, 2016

(65) Prior Publication Data
US 2017/0351475 A1 Dec. 7, 2017

(30) Foreign Application Priority Data

Jan. 5, 2015 (GB) .................................. 1500073.0

(51) Int. Cl.
*G09G 3/00* (2006.01)
*G06F 3/00* (2006.01)
(Continued)

(52) U.S. Cl.
CPC ............. *G06F 3/1446* (2013.01); *G09G 3/32* (2013.01); *H05K 1/028* (2013.01);
(Continued)

(58) Field of Classification Search
CPC ................. G09G 2330/02; G09G 3/32; G09G 2320/0233; G09G 2320/0242;
(Continued)

(56) References Cited

U.S. PATENT DOCUMENTS

| | | |
|---|---|---|
| 5,785,415 A | 7/1998 | Matsumura et al. |
| 5,900,850 A | 5/1999 | Bailey et al. |

(Continued)

FOREIGN PATENT DOCUMENTS

| | | |
|---|---|---|
| DE | 3633565 A1 | 4/1998 |
| DE | 19962900 A1 | 7/2001 |

(Continued)

OTHER PUBLICATIONS

International Search Report (ISR) dated Apr. 29, 2016, for PCT/EP2016/050064.

(Continued)

*Primary Examiner* — Muhammad N Edun
(74) *Attorney, Agent, or Firm* — Bacon & Thomas, PLLC

(57) ABSTRACT

A tiled display including discrete luminous sources distributed over at least two adjacent flexible display tiles, each of the flexible display tiles being configured to drive the discrete luminous sources on it when connected to a power supply and when receiving data and control signals. The power, data and control signals are provided to the tiles through conducting tracks formed on a carrier substrate, where an electrical connection between a first conductor on the carrier substrate and a second conductor on a tile is established using a connecting element having a resilient means keeping it pressed and in contact with a surface of the first conductor or second conductor. Additionally, a carrier substrate and to a flexible display tile for use in such tiled displays.

9 Claims, 20 Drawing Sheets

(51) Int. Cl.
*G06F 3/14* (2006.01)
*G09G 3/32* (2016.01)
*H05K 1/02* (2006.01)

(52) U.S. Cl.
CPC ............... *G09G 2300/026* (2013.01); *G09G 2320/0233* (2013.01); *G09G 2320/0242* (2013.01); *G09G 2330/02* (2013.01); *G09G 2380/02* (2013.01)

(58) Field of Classification Search
CPC ......... G09G 2380/02; G09G 2300/026; H05K 1/028; G06F 3/1446
See application file for complete search history.

(56) References Cited

U.S. PATENT DOCUMENTS

| | | |
|---|---|---|
| 6,252,564 B1 | 7/2001 | Albert et al. |
| 7,071,620 B2 | 7/2006 | Devos et al. |
| 7,102,601 B2 | 9/2006 | Devos et al. |
| RE41,603 E | 8/2010 | Matthies |
| 8,434,963 B2 | 5/2013 | Alkas et al. |
| 2001/0024891 A1 | 9/2001 | Chien |
| 2002/0022383 A1 | 2/2002 | Sakata et al. |
| 2002/0074157 A1 | 6/2002 | Kato et al. |
| 2003/0234343 A1 | 12/2003 | Cok et al. |
| 2005/0178034 A1 | 8/2005 | Schubert et al. |
| 2007/0218751 A1 | 9/2007 | Ward |
| 2009/0322651 A1 | 12/2009 | Tennagels |
| 2010/0135032 A1 | 6/2010 | Franklin et al. |
| 2011/0090691 A1 | 4/2011 | Markle et al. |
| 2013/0044501 A1 | 2/2013 | Rudisill et al. |
| 2015/0267907 A1* | 9/2015 | Thompson ............... F21V 23/06 362/249.06 |
| 2016/0035924 A1* | 2/2016 | Oraw ................... H01L 31/0508 136/244 |
| 2016/0267835 A1* | 9/2016 | Meersman ............... G09G 3/32 |

FOREIGN PATENT DOCUMENTS

| | | |
|---|---|---|
| EP | 0731436 A1 | 9/1996 |
| EP | 1217807 A1 | 6/2002 |
| EP | 1469450 A1 | 10/2004 |
| EP | 1650731 A2 | 4/2006 |
| EP | 1716553 A1 | 11/2006 |
| EP | 2023391 A2 | 2/2009 |
| EP | 2110801 A2 | 10/2009 |
| EP | 2459888 A1 | 6/2012 |
| FR | 2904731 A1 | 2/2008 |
| FR | 2908955 A1 | 5/2008 |
| GB | 2519587 A | 4/2015 |
| WO | 2006/098727 A1 | 9/2006 |
| WO | 2007/146885 A2 | 12/2007 |
| WO | 2014/002085 A1 | 1/2014 |

OTHER PUBLICATIONS

Written Opinion dated Apr. 29, 2016, for PCT/EP2016/050064.
Second Written Opinion dated Dec. 19, 2016, for PCT/EP2016/050064.
International Preliminary Report on Patentability dated Apr. 13, 2017, for PCT/EP2016/050064.
British Search Report dated Jul. 6, 2016, for GB 1500073.0.

* cited by examiner

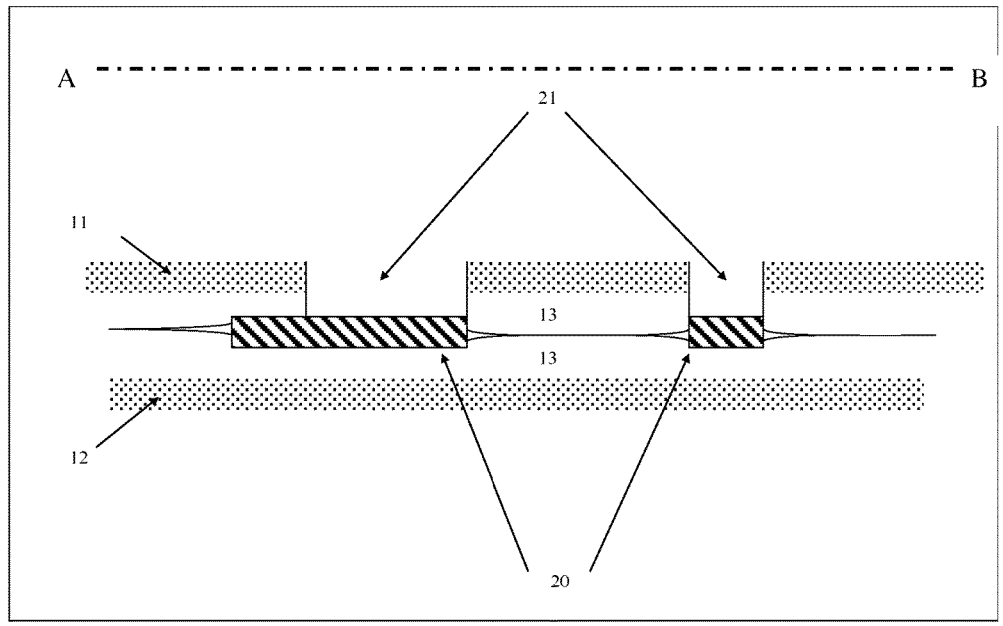
Figure 3a
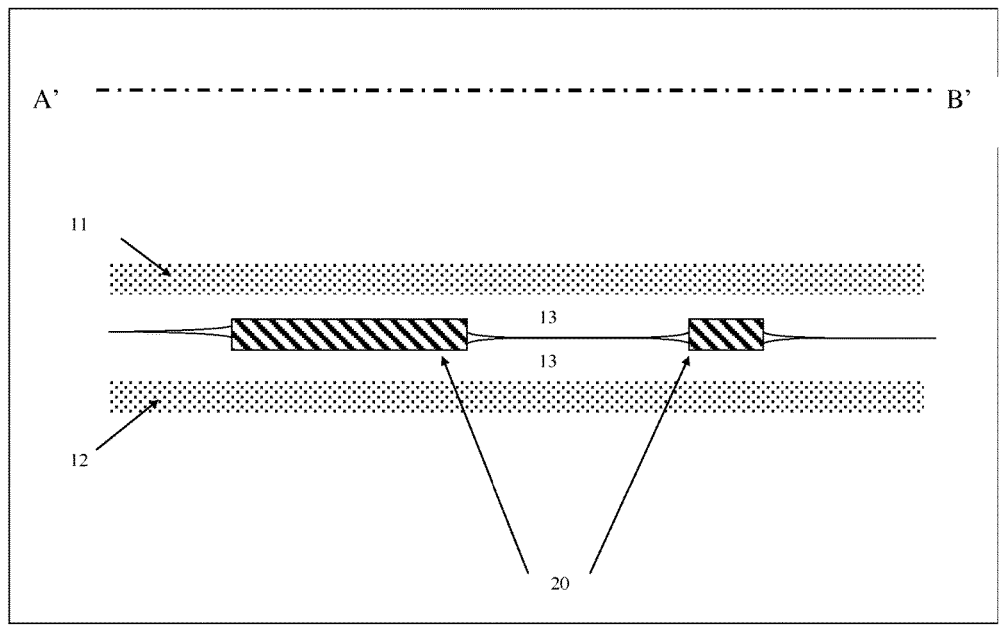
Figure 3b
Figure 3

TILED DISPLAY, AND DISPLAY TILE AND CARRIER SUBSTRATE FOR USE IN SAME

The present invention pertains to the field of displays, in particular to the field of tiled displays and display tiles and carrier substrates for use therein.

BACKGROUND OF THE INVENTION

As exemplified by the LED display described in U.S. Pat. No. 5,900,850, typical large tiled display devices require bulky structures to support the display tiles and keep them aligned.

U.S. Pat. No. 8,434,963, assigned to ORBUS, and EP 2 459 888 A1, in the name of the present applicant, give other examples of metallic support structures made of pultruded beams. Both documents describe solutions to problems such as axial and planar alignment of display tiles and illustrate problems such as assembly and disassembly of the support structure and concealment of the support structure.

US 2010/0135032 and US 2007/0218751, both assigned to Element Labs, Inc., are more particularly concerned by hanging tiled displays. They offer solutions to simplify assembly and maintenance of such displays but these solutions still present challenges at the time of assembly and disassembly.

EP 1 650 731 A1, in the name of the present applicant, discusses the mounting and fastening of one display element or tile to a display structure. EP 2 110 801 A2, in the name of Element Labs, Inc., is concerned with the fastening of the display element or tiles to a support structure and the alignment of the display tiles. While the solutions proposed in both documents simplify the assembly and servicing of the display element, both the fastening means and the support structure remain cumbersome.

One of the disadvantages of conventional LED display screens is that they are large, thick and heavy. For example, a 1 $m^2$ 8×8 LED display module 8 (2088AEG) weighs about 24.6 kg. Strong and heavy frames or supports are needed to support these LED display screens to ensure safety in the assembling process. The thickness of a conventional LED display screen is in the range of 5 cm to 50 cm. These conventional LED display screens are made of rigid PCB and can only be mounted on flat surfaces.

In one embodiment of EP 2 023 391 A2, a flexible LED screen may include a fixation layer coupled to a rear surface of the flexible printed circuit board to facilitate the fixing of the flexible LED screen to a support structure.

The fixation layer includes a plurality of openings sized and shaped to allow the integrated circuits to be situated therein. The fixation layer may be made of magnetic rubber and may have a thickness of about 1.5 mm. The fixation layer serves to fix the flexible printed circuit board on a wall or any supporting structure.

If fixed on a wall, connection means to power, data, and control signals must be provided.

If the flexible LED screens described in EP 2 023 391 A2 are tiles of a larger tiled LED display, the number of power and signal conducting cables and connectors increases rapidly. The number of cables may make the resulting structure very cumbersome. The cables may have to be hidden behind the display for aesthetic reasons, in which case a solution has to be found to guarantee that cables snaking between wall and the fixation layer will not affect the stability of the structure (e.g., by weakening adhesion to the wall) and will not introduce visual artefacts (by local bending of the tiles at those places where cables and tiles are in contact).

The cables may have to be routed between the tiles, in which case the dimensions of the cables will impose a minimum pixel pitch and resolution to avoid visual artefacts caused by pixel pitch variation between the outer pixels of adjacent tiles.

A screen of large dimensions is usually realized by combining several identical screen units of smaller dimensions. In most cases, a seam will be visible at the border between two adjacent units or tiles. Those seams have to be kept as discrete as possible and are often painted in black. To make things worse, thermal expansion can cause the seams to evolve differently across the screen with serious consequences for the visual perception of the displayed image. One of the main specifications of display quality is uniformity in color and brightness. For a tiled display, obtaining color and brightness uniformity is often even more difficult, because the tiles and their seams form a regular structure, which is very easily detected by the human eye. It is known that if a human eye observes a uniform plane, even the smallest local non-uniformities, such as a small variance on the mechanical seams, become visible.

Flexible LED strips are now available off-the-shelf (see FIG. 1a). They consist of a flexible substrate with adhesive tape on one side and LEDs and conducting tracks on the other side. The strips can be glued even to irregular surfaces. The flexible substrate is of the type commonly found in electronic appliances. The strips are available as 5 meter rolls. Realizing a display with N>1 rows of M>1 LEDs can be considered easy if there is a wall or surface available to glue the strips. Each strip will also have to be connected to a controller or the strips will have to be daisy-chained with ad-hoc cabling that is likely to be as cumbersome as that of the solutions previously described. The control of the pixel pitch between two parallel strips can be difficult to guarantee, which means that visual artefacts are likely to affect the display synthesized with the N>1 parallel strips. EP 1 716 553 A1 discloses a flexible tiled display 50 (see FIG. 1b) that solves some of the problems encountered with the LED strips. Flexible strips 30 comprising Light Emitting Diodes (LED) are cut so that each comprises a given number of LED modules 40 and/or has the required length for the flexible display 50. The strips are placed parallel to each other on a peripheral flexible circuit 60. The flexible circuit 60 consists of a flexible substrate (made of e.g. polyimide or PVC) on which electrically conducting tracks 22 have been formed. The tracks 22 connect the flexible strips 30 to supply and control circuits 20 via solder point 21 between tracks 22 on the substrate 60 and tracks 31 on the flexible strips 30. The tracks 22 are located on the periphery of the flexible substrate 60 and the flexible display 50. In essence, the display 50 consists of several tiles 30 spread over a single substrate 60.

The problems with the display proposed in EP 1 716 553 A1 are:

(a) The length L of the portions of conductor strips 31 on both extremities of flexible strips 30 must be at least as long as the width W of the bundle of tracks 22 to allow connections between all tracks 31 and tracks 22. The ribbons being produced continuously and cut to length to fit on the circuit 60, this means that the distance between pixel modules 40 on the flexible strips 30 will have to be equal or larger than W. The achievable resolution is therefore limited by the width of the tracks 22. Indeed, if two tiles 50 were assembled side by side to realize a larger tiled display, L and W have to be equal in order not to introduce visual artefacts caused by variation in the distance between pixels on the adjacent edges of the two tiles.

(b) The flexible strips 30 must be almost as long as the display 50 itself. For large displays 50 this may be a problem. Indeed, flexible LED strips are available as rolls of e.g. 5 meter or 10 meter long. A display with dimensions larger than 5 or 10 m would therefore require the tiling of at least two displays 50 as described in EP 1 716 553 A1, leading to the assembly problems discussed earlier. There would also be a problem between tiles. The distance between tiles would be at least twice the width W of the bundle of conductor strips at the periphery of the displays 50. The pixel pitch across the tiled display would therefore not be constant and lead to undesirable visual artifacts.

(c) If one LED module is defect, on-site servicing will require the replacement of the entire tile 30 on which the defect LED is located as is usually the case for tiled displays (see e.g. US RE 41,603 E). The dimension of the tile 30 being always as large as either the length or width of the display 50, this is not practical for displays several meters across, in particular if the replacement has to be done on site.

(d) The tracks 31 on tile 30 have to conduct power to all the LEDs on that tile. This will either require increasing the thickness of the tracks 31 or changing the material of which they are made (impacting flexibility and/or cost) or their width (which may require increasing the width of the flexible strip 30 and decrease the resolution).

(e) The connections (solder points) 21 between tracks 22 and 31 will have to conduct the current needed for all the LEDs on tile 30. For large displays this may lead to reliability issues as current increases linearly with the number of LED on the tile 30.

(f) Even if the strips 30 can be made long enough to extend from one end to another of a very large tiled display 50, the substrate 60 still has to be of one piece. Any problem with the substrate 60 would then require a disassembly of the entire display. For very large displays, this can be too unpractical and/or costly.

US patent application publication no. 2009/0322651 A1, in the name of Thomas Tennagels, relates to a display device for the presentation of visual content at big events and to a display method for the presentation of such content. The device comprises a plurality of display elements (e.g. LEDs or clusters of LEDs) connected with carrier elements, the display elements being disposed in rows. Furthermore, the display device comprises a carrier rail for mechanically fastening the carrier elements and to supply the display elements with voltage and control signals. The rows of the display elements extend at least partially in several directions, starting from the carrier rail. The control signals originating from the carrier rail are transmitted via a feed element in a direction of a display element row, wherein the signals are deflected at a first end of the display element row through a first end cap in the direction of a second end of the display element row, then deflected at the second end of the display element row by a second end cap in the direction of the carrier rail, and deflected back into the carrier rail via the feed element. In the disclosed system, the carrier elements are rigid tubes and the carrier rail is a single piece, common to the entire display device.

In DE 3633565 A1, in the name of Licentia GmbH, in order to fit integrated circuits onto a substrate which is provided with conductor tracks, and to make contact with said integrated circuits, it is proposed additionally to fit a flexible supply lead and then to connect the connecting tabs of the integrated circuits electrically and mechanically to the conductor tracks of the substrate by means of pressure and a non-conductive adhesive, and to connect them to the conductor tracks of the supply cable by soldering. This method does not provide a solution to the problems associated with large modular display systems.

European patent application publication no. EP 1 469 450 A1 in the name of the present applicant is concerned with OLED display devices, which may be tiled such that a seamless large-screen display is achieved, and which may be individually back-coupled by means of connections to respective backing elements such as PCBs. This document is not concerned with flexible display tiles, and it does not disclose using a common substrate carrying multiple display tiles.

SUMMARY OF THE INVENTION

Embodiments of the present invention solve some of the problems of the prior art by providing a tiled display, using flexible display tiles, a flexible carrier substrate, and a judiciously designed connection mechanism between the tiles and the substrate.

For the purposes of the present description, terms such as "top" and "bottom" refer to the side of the panel on which the light emission takes place and the opposite side, respectively, and the term "vertical" refers to the direction perpendicular to the top and bottom planes.

What is desired is a tiled display requiring a minimum of ad-hoc cabling, with as little perceptible discontinuity as possible at the seams (the region of a tiled display between two adjacent tiles), requiring as little support infrastructure as possible, with little or no impact on the reliability of the mounted display (mechanical failure, degrading performances over time and in particular variations of the distance between adjacent tiles, easy maintenance . . . ). The components of the display should be modular to allow the realization of displays with arbitrary numbers of rows and columns of LEDs (or more generally pixel or picture elements) with off-the-shelf components and parts. The display should include flexible components so as to accommodate different geometrical deployments.

According to an aspect of the present invention, there is provided a tiled display comprising discrete luminous sources distributed over at least two adjacent flexible display tiles, each of the flexible display tiles being configured to drive the discrete luminous sources on it when connected to a power supply and when receiving data and control signals; wherein the power, data and control signals are provided to the tiles through conducting tracks formed on a carrier substrate, wherein an electrical connection between a first conductor on the carrier substrate and a second conductor on a tile is established by means of a connecting element comprising a resilient means keeping it pressed and in contact with a surface of the first conductor or second conductor.

Throughout this application, the expression "driving the discrete luminous sources" is meant to comprise individually controlling luminous sources by means of adequate data and control signals so as to form an image.

In an embodiment, the resilient means comprises a body of compressible conductive material.

In this embodiment, the connecting element generally comprises a body of a compressible and conductive material, such as a conductive rubber or foam, shaped so as to bridge a gap, when compressed, between two elements that have to be connected to each other in an electrically conductive manner. The connecting element may be permanently attached to the carrier substrate and conductively connected to a conductive track thereon, and by its shape and compressibility keep itself pressed against a conductor on the tile. Alternatively, the connecting element may be permanently attached to the tile and conductively connected to a conductor thereon, and by its shape and compressibility keep itself pressed against a conductive track on the carrier substrate.

An adequate shape for the body of material may be a cylinder, the height of which in uncompressed condition is such that it exceeds to some extent the height of the gap between the elements to be connected. The reaction force exerted by the surface of the first or second conductor on the loose end of the body of material, guarantees a good electrical contact.

In an embodiment, the resilient means comprises a mechanism applying a force on a part of the connecting element and keeping said part in contact with said surface of the first conductor or the second conductor.

In this embodiment, the connecting element generally comprises a mechanism that is capable of extending its shape so as to bridge a gap between two elements that have to be connected to each other in an electrically conductive manner, in particular through the action of a mechanical stress. A connecting element may be permanently attached to the carrier substrate and conductively connected to a conductive track thereon, and have a mechanism that applies a force on a part of the connecting element so as to press the latter against a conductor on the tile. Alternatively, a connecting element may be permanently attached to the tile and conductively connected to a conductor thereon, and have a mechanism that applies a force on a part of the connecting element so as to press the latter against a conductive track on the carrier substrate.

In a particular embodiment, the connecting element is a spring contact or a pogo-pin. In such an embodiment, the conductive edges of the connecting element are pushed apart by the counteracting force of the partially compressed spring, so as to ensure a reliable contact across the spatial gap between the tile and the carrier substrate.

In some embodiments of the invention, the connecting element is soldered to the first conductor on the carrier substrate, and, when in use, it presses itself or a part of the connecting element against a surface of the second conductor on the tile.

In some embodiments of the invention, the connecting element is soldered to the second conductor on the tile and, when in use, it presses itself or a part of the connecting element against a surface of the first conductor on the carrier substrate.

The resilient means should have a spring constant (if it is a spring) or Young's modulus (if it is a body of compressible material) that balances sufficient compressibility to allow manual mounting with sufficient rigidity to ensure good electrical contacts. The term "compressible" should be understood according to those criteria. The skilled person will be able to determine appropriate parameters without undue burden. For example, a conductive foam or rubber having a Young's modulus in the range of 10 to 100 MPa may be used.

Preferably, at least one of the conducting tracks extends from one edge of the carrier substrate to the opposite edge of the carrier substrate. The tiled display is preferably flexible.

Modularity of the proposed system is enhanced when at least one of the conducting tracks providing the power, data and control signals extends from one edge of the carrier substrate to the opposite edge of the carrier substrate along the length of the carrier substrate, as shown in FIG. 2b. Modularity means that the same carrier substrate can be used to realize display tiles of different dimensions and/or accommodating tiles of different dimensions from one tiled display to the other as illustrated by FIGS. 6a and 6b.

The modularity is further enhanced when at least one of the power, data or control signals is provided on at least two separate conductive tracks on the carrier substrate.

The modularity is further enhanced when the power, data and control signals are each provided on at least two separate conductive tracks on the carrier substrate. This can be used to improve the reliability of the display panel. Indeed, let us consider a tiled display with each display tiles overlapping two sets of power, control and data signal tracks as illustrated on FIG. 6c. If the power were lost on e.g. one of the conductive tracks, the corresponding signal would still be provided to the tile by the other power track running under the tile. Depending on the design of the display tiles, the power will be available to those LEDs that draw power from the remaining track, thereby allowing a "graceful" degradation of the performance of the system versus all LEDs of the tile being unpowered or the power provided by the remaining track can be redistributed.

The modularity is further enhanced when the pattern of conductive tracks carrying the power, data and control signals is periodical as illustrated on FIG. 2b.

The enhanced modularity of a tiled display system according to this invention is further illustrated by FIG. 7. A tiled display of arbitrary dimensions can be realized by juxtaposing carrier substrates. To avoid the "fly curtain effect" (e.g. carrier substrates and their tiles swinging independently of each other in the wind), the tiles can be used to fasten two adjacent carrier substrates together by fastening a tile to each of the carrier substrates and connecting it to the tracks on each of the carrier substrate. This may also improve the reliability of the tiled display: if power, data and or control signals were lost on e.g. the left carrier substrate C1, the tiles overlapping the two carriers (e.g. T3 and T4) can, if designed accordingly, act as a bridge and provide the missing signal to the tiles (T5 and T6) entirely connected to the tracks on the right carrier substrate C2.

Adjacent substrates can be solidarized by bridging tiles as described here above. Instead of bridging tiles or in addition to bridging tiles, adjacent substrates can also be adapted to allow mutual mechanical engagement. In one embodiment, adjacent substrates can be "zipped" together. For this purpose, each side of the carrier substrate is equipped with a row of protruding teeth. Fastening the adjacent carrier is done by help of a slider. Instead of protruding teeth, the principle of the dovetail joint can be used, e.g. as used in re-sealable plastic bags. Any combination of shapes that allow being brought into positive engagement by applying an adequate amount of joining force may be used for this purpose. Higher modularity and flexibility of use appears to be achieved when one side of a carrier substrate is provided with a first edge shape, e.g. the male component, and the other side of the same carrier substrate is provided with the complementary edge shape, e.g. the female component. The skilled person will be capable of determining the parameters of these shapes that provide an appropriate trade-off between the amount of force required to obtain engagement, and the structural rigidity of the resulting joint.

Snap fasteners or press studs are yet another possible option to fasten two adjacent carrier substrates. To that end, the sides of a carrier substrate are lined with a row of first components of press studs to match second components of press studs on the matching side of adjacent substrate. Higher modularity and flexibility of use appears to be achieved when one side of a carrier substrate is lined with a single sort of press stud components, e.g. the male component, and the other side of the same carrier substrate is lined with the other sort of press stud components e.g. the female or grooved component.

The tiles can be connected to the tracks and in particular the control and data tracks in parallel or in series (e.g. the tiles can be daisy chained). Daisy chaining will require that the tracks be interrupted as illustrated on FIG. 6c.

In that case, it is advantageous (as explained for the contacts between tracks on the carrier substrate and the tiles) to have the tracks interrupted at regular intervals. Modularity of the proposed tiled display system will also be further improved if the distance between two consecutive interruptions is smaller or equal to the length of carrier substrate under any of the display tile connected to the conductive tracks.

The full advantage of the proposed invention is obtained when the tiles are identical to each other (at least those at the same level on the same and adjacent carrier substrate).

A further advantage of a tiled display system according to this invention is that a display tile can be cut along a line separating two sets of tracks carrying the power, control and data signals, thereby allowing the realization of a tiled display with a lateral dimension that is substantially equal to an integer number of times the width of a carrier substrate even if one or more of the tiles assembled on the carrier substrates extending over the edge of a carrier substrate. This further advantage is possible if the tiles are designed such that contacts on the tiles are available on the tiles for each set of tracks on the carrier substrate that a tile can overlap.

With a tiled display system according to this invention, the pixel pitch (i.e. the distance between two adjacent light emitting elements or the distance between two adjacent light emitting elements of the same color in e.g. RGB LED display) does not depend any more on the width of the bundle of tracks 20 and substantial variation of pixel pitch between two adjacent LED tiles can be avoided.

According to an aspect of the present invention, there is provided a carrier substrate having conductive tracks formed thereon for providing power, data and control signals to a display tile; wherein a connecting element is soldered to a first conductor on the carrier substrate, said connecting element being arranged to establish an electrical connection between the first conductor and a second conductor on the tile; and wherein the connecting element comprises a mechanism applying a force on a part of the connecting element and keeping it pressed and in contact with a surface of the second conductor.

According to an aspect of the present invention, there is provided a flexible display tile having discrete luminous sources distributed thereon, the flexible display tile being configured to drive the discrete luminous sources on it when connected to a power supply and when receiving data and control signals; wherein a connecting element is soldered to a second conductor on the tile, said connecting element being arranged to establish an electrical connection between said second conductor and a first conductor on a carrier substrate adapted to provide said power, data and control signals; and wherein said connecting element comprises a mechanism applying a force on a part of the connecting element and keeping it pressed and in contact with a surface of the first conductor.

The technical effects and advantages of embodiments of the carrier substrate and the flexible display tile according to the present invention correspond, mutatis mutandis, to those of the corresponding embodiments of the tiled display according to the present invention.

BRIEF DESCRIPTION OF THE DRAWINGS

These and other features and advantages of embodiments of the present invention will now be described in more detail with reference to the accompanying drawings, in which:

FIGS. 3a and 3b represent cross-sections as indicated in FIGS. 2a and 2b;

DETAILED DESCRIPTION OF THE INVENTION

Figure 1A:
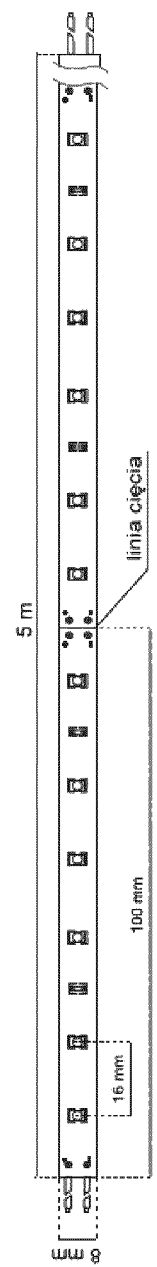
FIG. 1a illustrates a flexible LED strip.
Figure 1B:
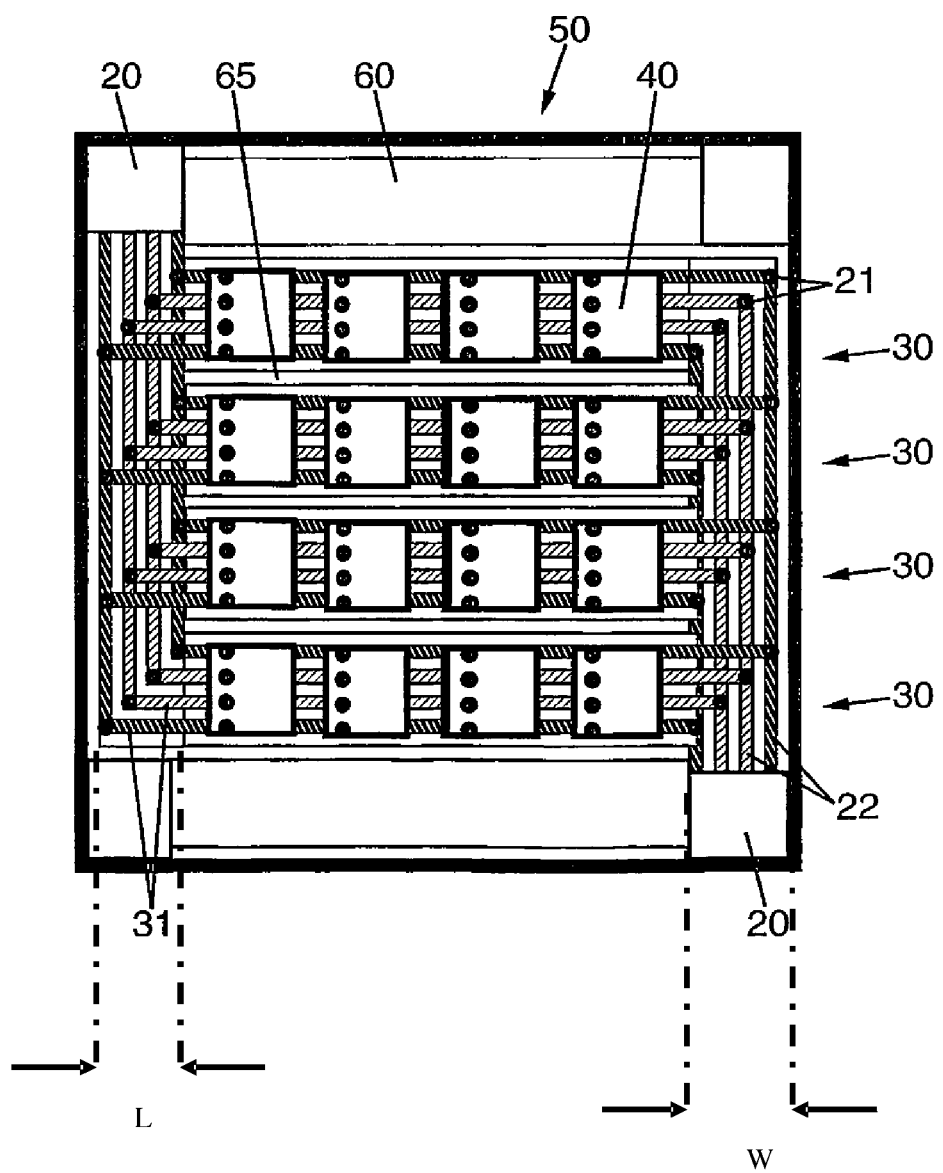
FIG. 1b illustrates a display disclosed in EP 1 716 553 A1.
Figure 2A:
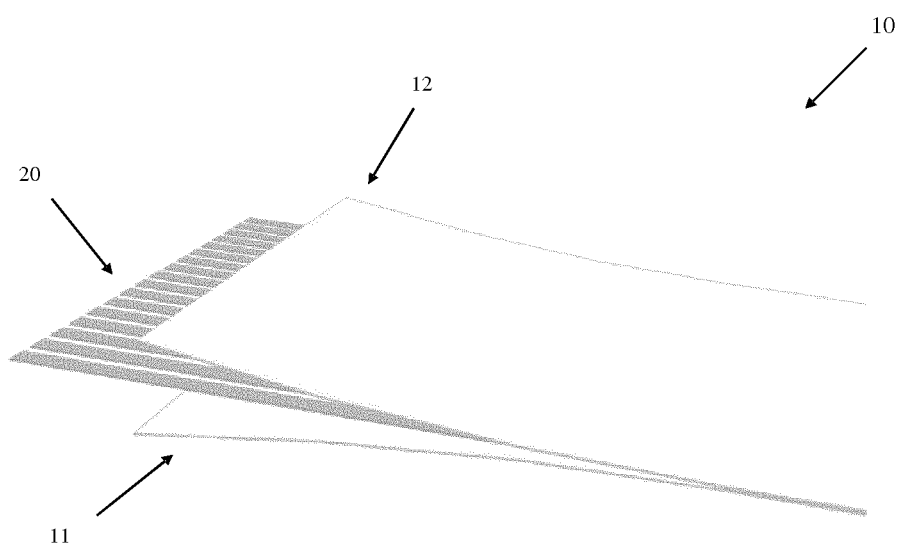
FIGS. 2a and 2b illustrate a flexible substrate with electrically conducting tracks according to an embodiment of the invention.
Figure 2B:
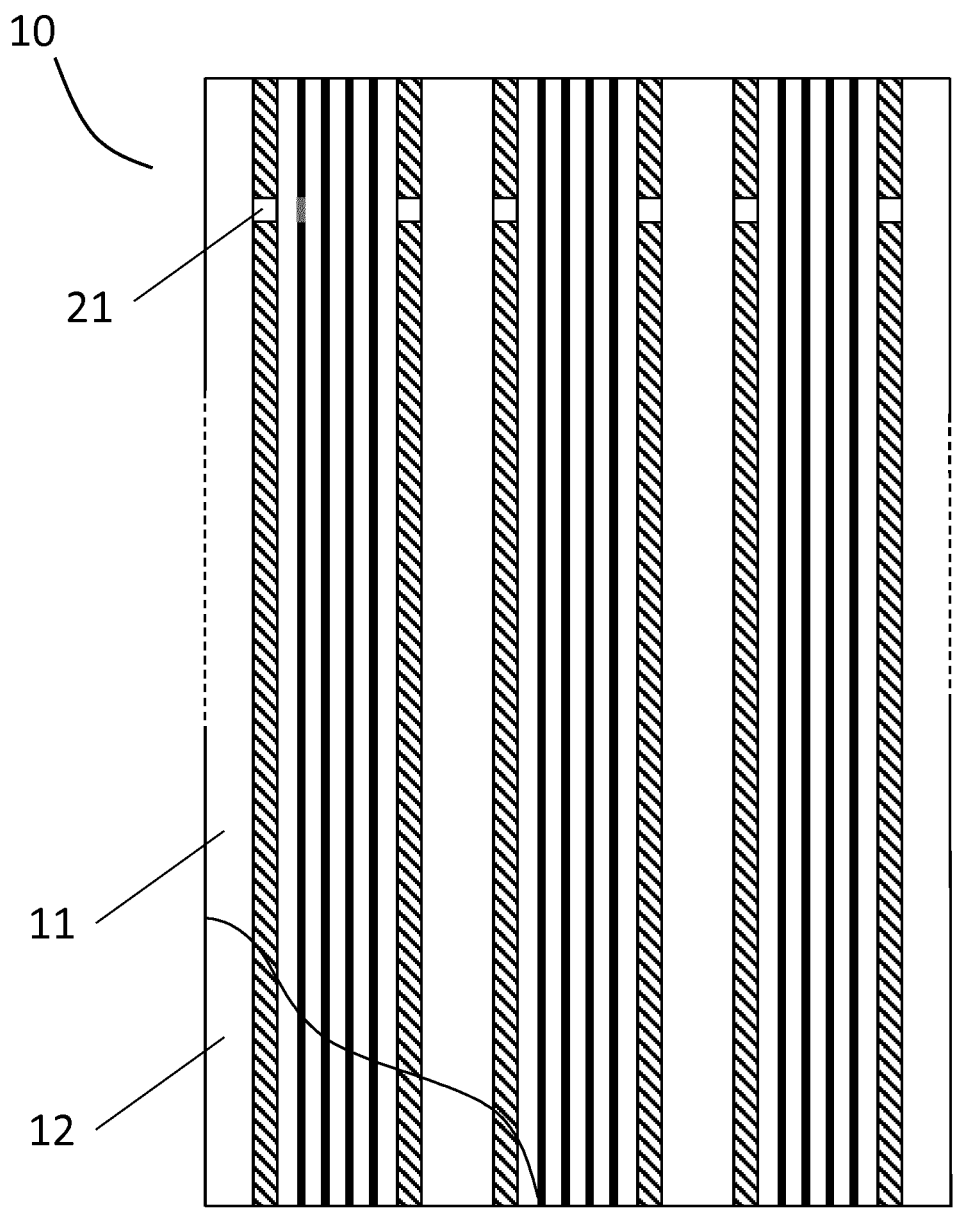

FIGS. 2a and 2b show a flexible substrate 10 with electrically conducting tracks 20 according to an embodiment of the invention. Each one of the conducting tracks is meant to carry power, data or control signals to LED tiles. For instance, power is conducted through the GND and VSS tracks. The other tracks carry a DATA CLCK signal, DATA (or Video Signal) and COMMAND SIGNAL (the signals considered in e.g. U.S. Pat. No. 7,102,601 to control a tiled LED display; U.S. Pat. No. 7,102,601 is assigned to the present applicant, and its contents, including in particular the description of FIG. 2 therein, are incorporated herein by reference for the purpose of describing the cited signals).

The tracks carrying DATA CLCK, DATA and COMMAND SIGNAL may be interrupted at regular intervals as will be discussed in more detail further below.

In a first preferred embodiment, the conducting tracks 20 are positioned between a first material layer 11 and a second material layer 12. The first and second layers 11 and 12 can be made of the same material (e.g. a polyimide). Layers 11 and 12 are preferably made of an insulating material. Additional layers can come between the first or second layer and the conducting tracks. Both layers 11 and 12 can have the same or different thicknesses. While the description will mainly consider a polyimide for layers 11 and 12, other materials including textiles and cloths may be used.

The conducting tracks can be made out of copper foil. A typical thickness for the conducting tracks is 10 to 100 μm, giving a lot of flexibility to the substrate 10 with low risk of mechanical fracture along the tracks 20. Other conducting materials can be used like e.g. gold or aluminium. Indium Tin Oxide (ITO) may even be contemplated for low power tiled displays (e.g. reflective displays where electrophoretic elements, e-paper or even liquid crystal elements would replace the LEDs on the tiles) that do not require high drive current for prolonged periods of time.

The flexible substrate 10 or carrier substrate can be produced continuously as rolls of a fixed width.

The copper tracks 20 can be laminated between two polyimide foils 11 and 12 as schematized on FIG. 2a to form a flexible substrate 10.

If the layers 11 and 12 are made out of a fabric or a cloth, the conductive tracks 20 can be electrical wires glued to, woven into or embroidered on one or both of the layers 11 and 12.

The conductive tracks can also be formed on one of the foils 11 or 12 by a usual deposition process followed by a selective etching process. The layers 11 and 12 are then glued or laminated together. In some cases, for displays operating in mild atmospheric conditions, it may even be sufficient to form the conducting tracks on a single polyimide foil and cover them with a varnish.

Openings 21 are made in one of the polyimide foils to allow access to the copper tracks. Those openings are made at regular intervals along the length of the substrate 10 as exemplified on FIG. 2b. FIGS. 3a and 3b show a partial cross section of the carrier along axis AB and A'B' respectively (the cross section is not given from one side to the other along axis AB but is limited to the first few copper tracks 20). Each of the layers on FIGS. 3a and 3b has a typical thickness of 25 μm to 100 μm.

The openings 21 can be made with any suitable mechanical or chemical process like but not limited to e.g. punching, laser . . . before or after assembly with the copper tracks. If the conductive tracks were merely covered with a varnish, the openings 21 may be obtained by masking the places where openings 21 are needed with e.g. a stencil. After the varnish has been sprayed, the masks are withdrawn, leaving an opening 21 on the conducting tracks for connection to other conductors and electronics as will be described later. When we will refer to conductive tracks being formed on the carrier substrate 10, it will be understood that the conductive tracks can be either sandwiched between two foils, formed on a single layer or woven or knit as electric wires within the fabric of a cloth.

According to embodiments of the invention, electrical connection between the conductive tracks and the tiles are achieved by means of a connecting element comprising a mechanism applying a force on a part of the connecting element and keeping it pressed and in contact with a surface of the first conductor or second conductor.

As illustrated on FIG. 8, a spring contact has been soldered (with solder material 1315) to a copper track 1320 on the carrier substrate 1310 in an opening of the polyimide foil 1312. The spring contact 1302 can assume different forms. On FIG. 8, the spring contact consists of mainly two parts; a base 1302a and an arm 1302b at an angle with the base. Both base 1302a and arm 1302b are in metal like e.g. copper, aluminum or any other suitable metal. The arm 1302b behaves like a spring when the distance between its tip 1302c and the base 1302a is changed. As will be apparent to those skilled in the art, the geometry of the arm and the material of the arm are chosen to guarantee an elastic deformation of the arm. This will guarantee that the arm will return to its initial position when no force is applied.

As described earlier, a display tile can be fixed to the carrier substrate by means of an adhesive tape 1314 that has been pre-positioned on the carrier substrate. The top of the adhesive tape is protected by a foil that can be peeled. Once the foil has been peeled, a surface of the adhesive tape is accessible to assemble a tile to the carrier substrate. Openings in the adhesive tape allow to positioning and solder the spring contacts to the conductive tracks 1320 on the carrier substrate.

Figure 8A:
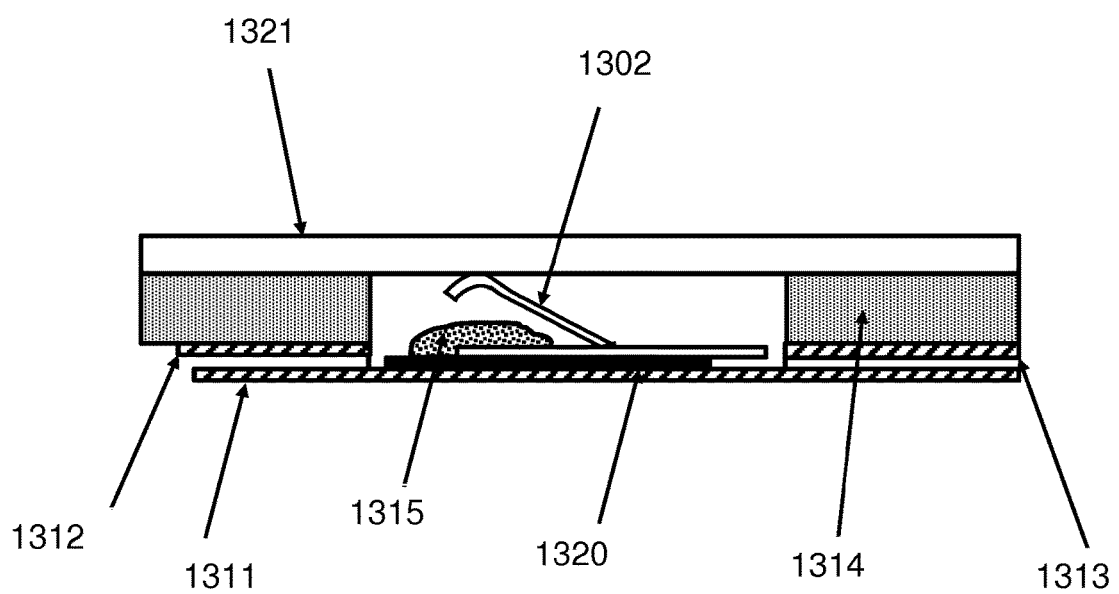
FIG. 8a shows a cross section of the carrier substrate and the adhesive layer in the neighborhood of a spring contact, when the protective foil is still attached to the adhesive layer.
Figure 8B:
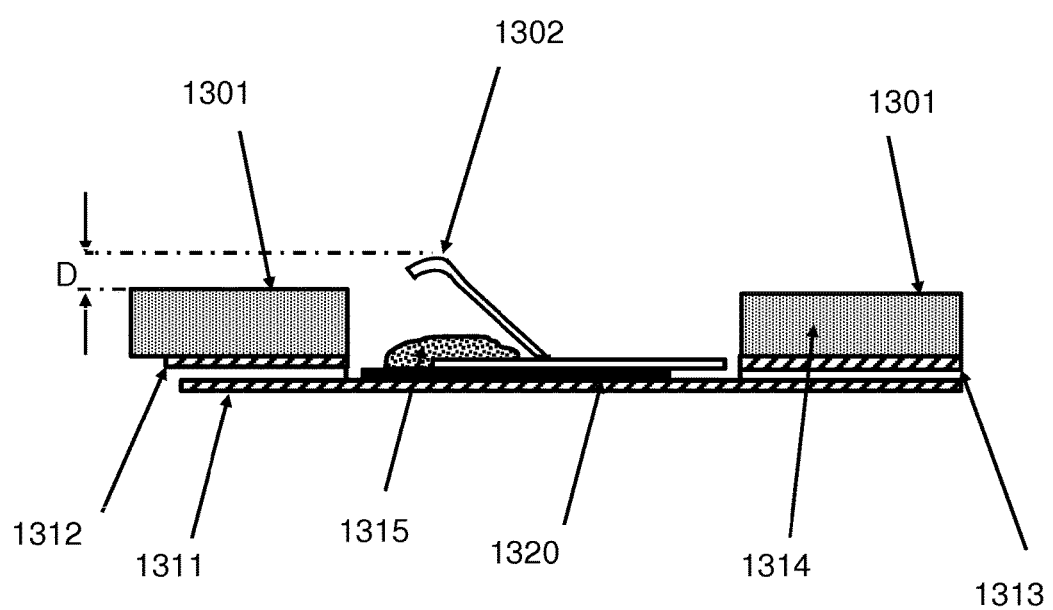
FIG. 8b shows a cross section of the carrier substrate and the adhesive layer in the neighborhood of a spring contact, when the foil has been peeled away.

The thickness of the adhesive tape 1314 is less than the distance between the tip 1302c of the arm 1302b and the base 1302a of the spring contact when no force is exerted on the tip 1302c. The arm 1302b and the tip 1302c of the spring contact thus protrude from the surface of the adhesive tape 1304. FIGS. 8a and 8b show a cross-section of the carrier substrate and the adhesive layer in the neighborhood of a spring contacts. FIG. 8a shows the situation when the foil 1321 is still attached to the adhesive layer and FIG. 8b shows the situation when the foil 1320 has been peeled away. Once the foil 1320 is peeled away, it does not apply a force on the tip 1302c and/or the arm 1302b of the spring contact 1302 and the tip 1302 comes out of the opening in the adhesive layer. Be d1 the distance between the tip 1302c of the spring contact and the carrier substrate and d2 the distance between the top surface 1301 of the adhesive layer 1314 and the carrier substrate, then d1=d2+D where D is>0.

Figure 9A:
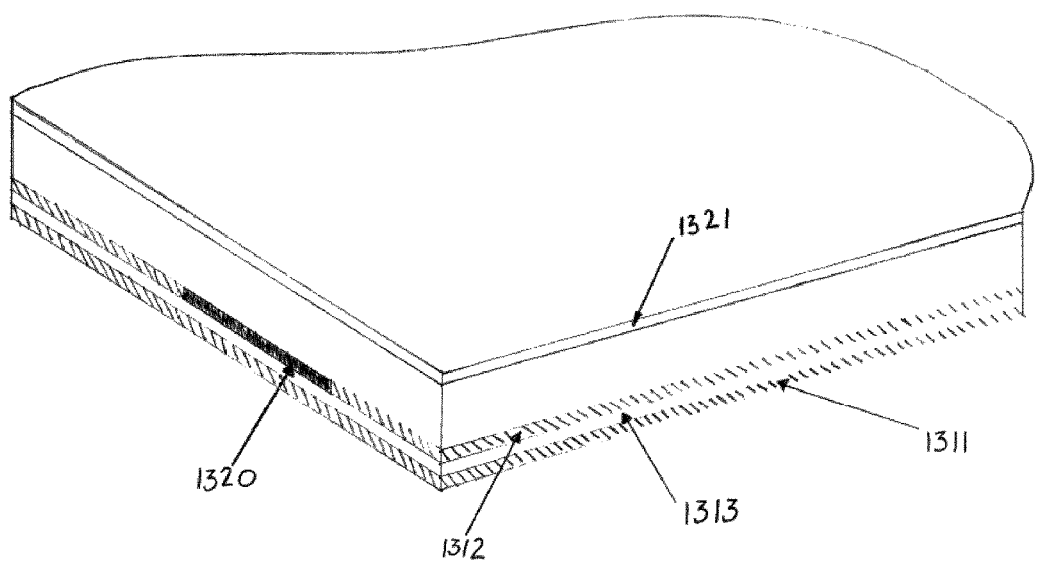
FIG. 9a shows a perspective view of a carrier substrate in the neighborhood of a spring contact before the protective foil has been peeled away.
Figure 9B:
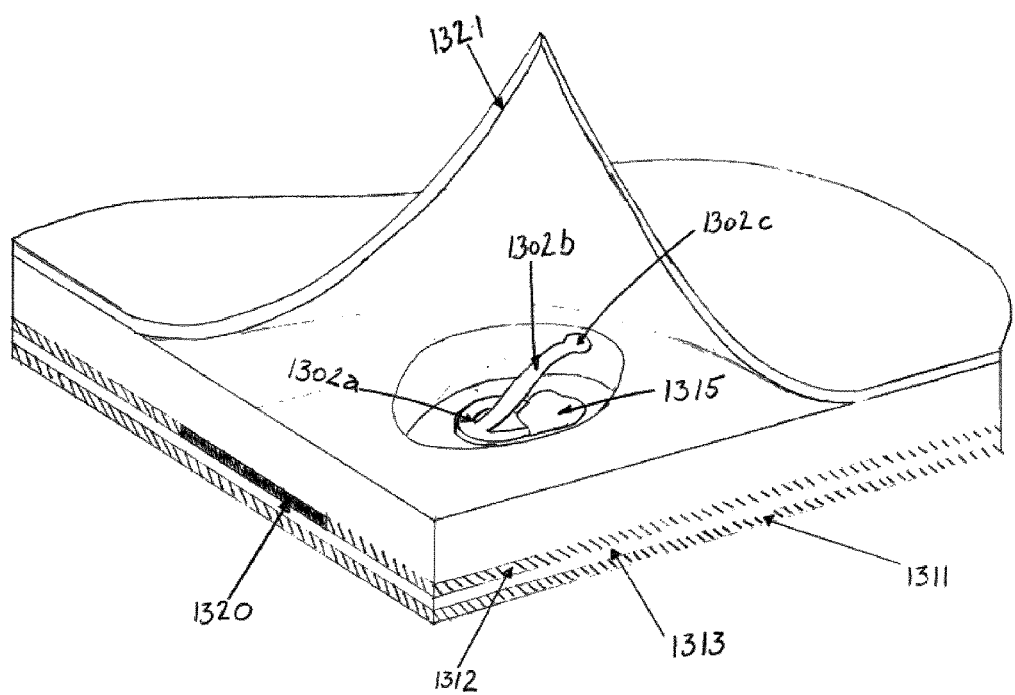
FIG. 9b shows a perspective view of a carrier substrate in the neighborhood of a spring contact after the protective foil has been peeled away.

FIGS. 9a and 9b show a perspective view of a carrier substrate in the neighborhood of a spring contact before and after the protective foil 1321 has been peeled away.

Figure 10A:
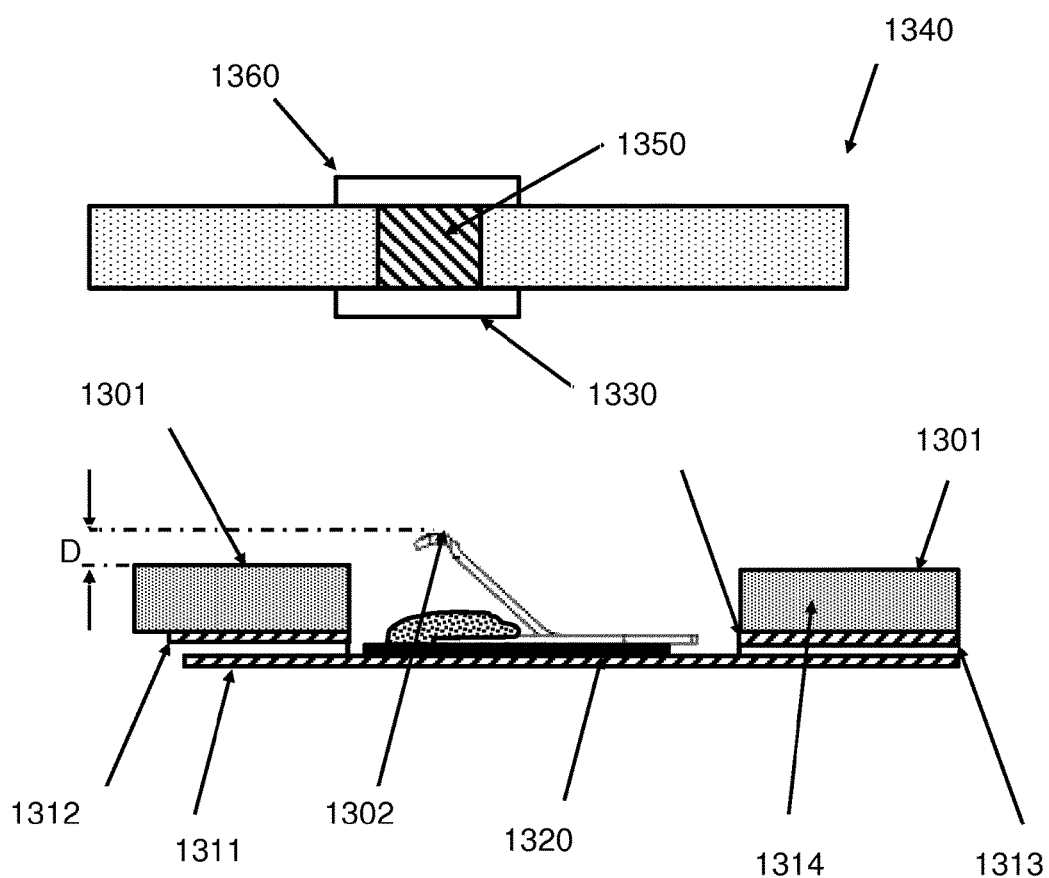
FIGS. 10a and 10b shows how an electrical contact is established between a conductive track 1320 on the carrier substrate and a conductive track 1360 on a tile 1340.
Figure 10B:
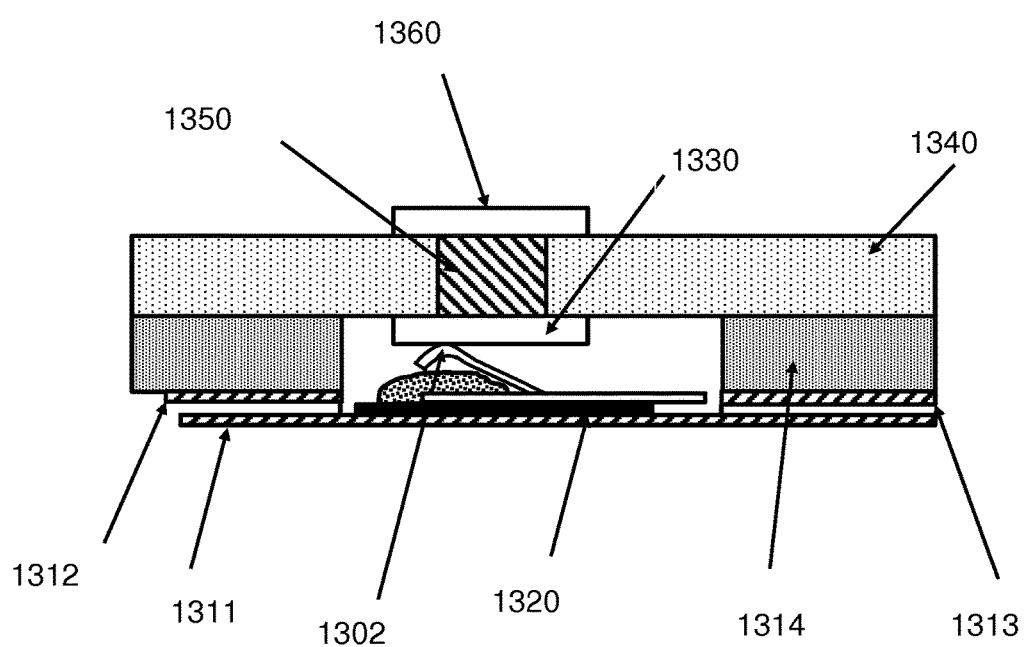

FIGS. 10a and 10b show how an electrical contact is established between a conductive track 1320 on the carrier substrate and a conductive track 1360 on a tile 1340.

Before assembling a tile 1340 and the carrier substrate 1310, the protective foil 1321 is peeled away.

Conductive pads 1330 on a backside of the tile 1340 are aligned with the corresponding openings in the adhesive layer 1314 and spring contacts 1302 on the carrier substrate 1310. The conductive pads 1330 are e.g. electrically connected to conductive tracks 1360 on a topside of the tile 1340 by an electrically conductive via 1350.

The tile 1340 is then pressed against the adhesive layer 1314. A force is thereby exerted by the pads 1330 on the tips 1302c and arm 1302b of the corresponding spring contacts 1302. The distance between the tip 1302c of the spring contact and the plane within which the base 1302a of the spring contact lies, a positive force presses the tip 1302c against the conductive pad 1330.

Any change in the distance d3 between the conductive pad 1330 and the conductive track 1320 will be compensated by the spring mechanism of the spring contact. If the distance d3 increases, the positive force applied by the spring mechanism of the spring contact will push the tip 1302c up and against the conductive pad 1330. If the distance d3 decreases, the arm 1302b will bend a little more. In both circumstance, a positive force will keep the tip 1302c pressed against the conductive pad 1330, thereby guaranteeing a proper electrical contact between the conductive track 1320 on the carrier substrate 1310 and the conductive pad 1330 on the tile 1340.

Figure 11:
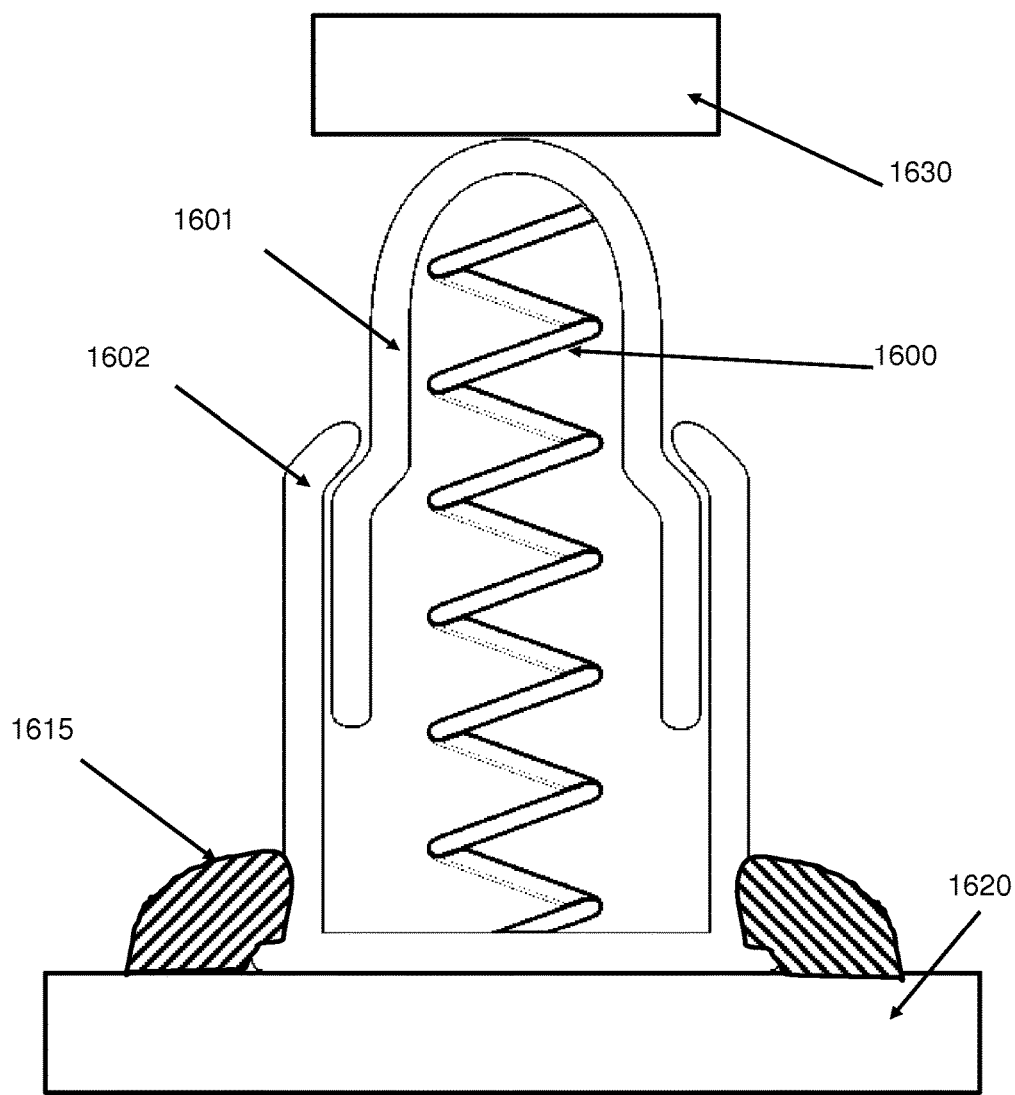
FIG. 11 gives a schematic representation of a pogo pin.

Other types of spring contacts can be used like e.g. pogo pins. FIG. 11 shows a schematic representation of a pogo pin.

A pogo pin is a device used in electronics to establish a (usually temporary) connection between two printed circuit boards. Named by analogy with the pogo-stick toy, the pogo pin usually takes the form of two sliding cylinders 1601 and 1602 in conducting material (e.g. gold, silver, copper etc. . . . ) loaded with a spring 1600. The cylinder 1602 is soldered with solder 1615 to the conducting track 1320 on the carrier substrate. The tip of the second cylinder is pressed against the pad 1630 on the tile.

Pogo pins may have to be very carefully designed to allow not only high reliability of the spring mechanism but also high-fidelity transmission of the electrical signals. The pins themselves must be hard, yet plated with a substance (such as e.g. gold) that provides for reliable contact. Within the body of the pogo pin, the pins must make good electrical contact with the body lest the spring carry the signal (along with the undesirable inductance that the spring represents).

In embodiments of the invention, a contacting element used to establish an electrical connection between a first conductor 1320 on the carrier substrate and a second conductor 1330 on a tile 1340 comprises a mechanism applying a force on a part 1302c of the connecting element and keeping it pressed against and in contact with a surface of the second conductor 1330.

The simpler spring contact described earlier appears to be a good trade-off to be used with flexible displays according to this invention.

The base 1302a of the contact spring 1302 can be either soldered or glued to the conductive track (or in an alternative embodiment to the pad 1330).

A portion of the base (e.g. see 1302ab on FIG. 12) can be used for picking up the spring contact (either with tweezers or a pick and place robot) and facilitate its positioning and soldering/gluing to a conductive track or pad).

A part of the base 1302a that will be soldered to a conductor can be plated to improve the electrical properties of the connection. Similarly, part of the tip 1302c can be plated for the same reason.

Figure 12:
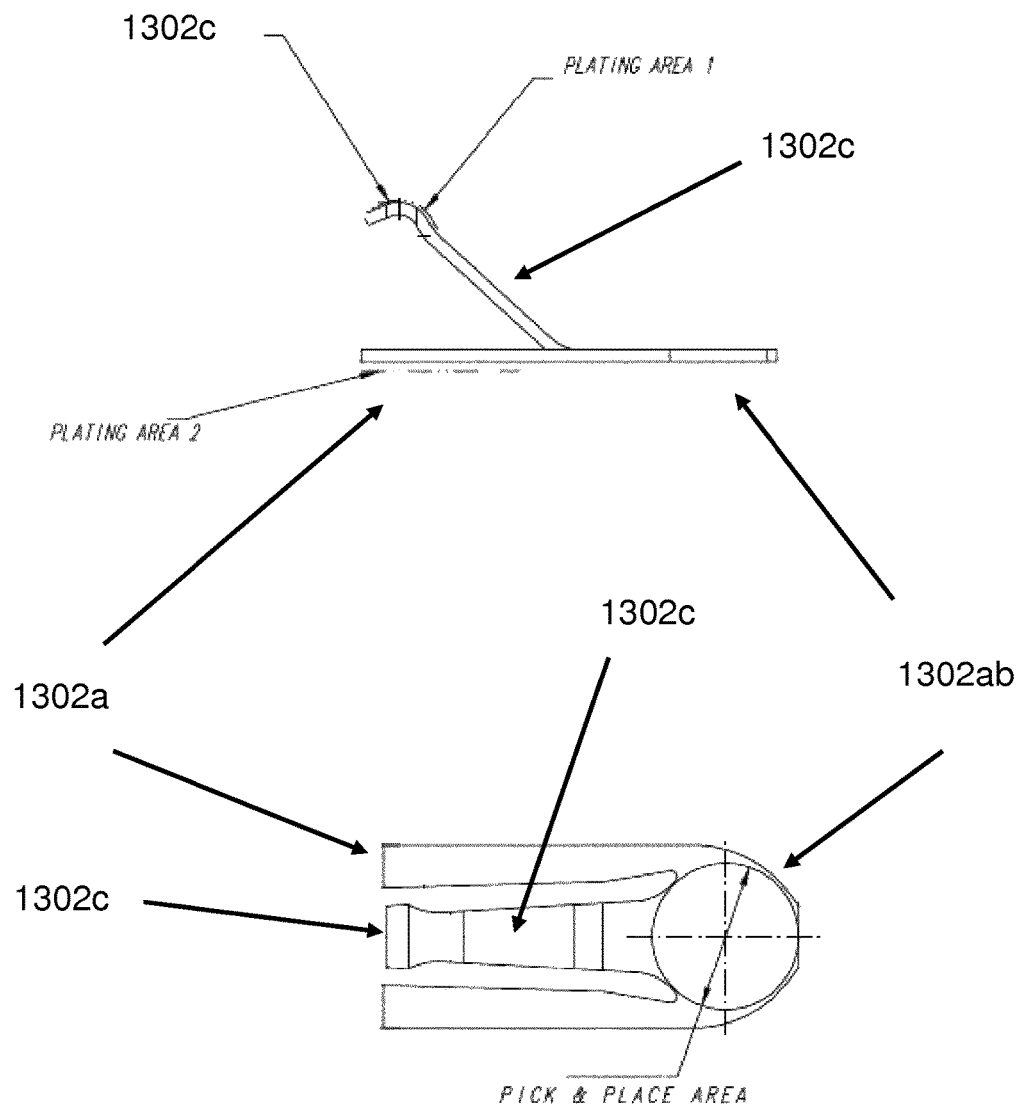
FIG. 12 shows projections of an example of spring contact.

FIG. 12 shows projections of an example of spring contact 1302.

Alternatively, the spring contact can be soldered to the pad 1330 on the tile and its tip pressed against the conducting track 1320 on the carrier substrate.

In addition to the mechanical connections according to the invention, as just described, electrical connection between some of the conductive tracks and the tiles may be achieved by means of a conductive adhesive with copper core 32. The conductive adhesive 32 is in contact with tracks 31 on the other side of tile 30 preferably trough a conductive via 33. An example of the structure resulting from the assembly of a tile 30 and a carrier 10 is given on FIG. 4. A cross section along the axis CD on FIG. 4 of a tile and the supporting carrier is given on FIG. 5.

Table 1 gives examples of materials that can be used for the connections 22, the tracks 20, and the foils between which the tracks are sandwiched and the adhesive used to assemble the different materials.

TABLE 1

| | |
|---|---|
| 20 | Copper foil |
| 11, 12 | Polyimide |
| 13 | acrylic adhesive |
| 22, 32 | Self adhesive conductive tape |

The polyimide (11, 12) and the acrylic adhesive (13) are presently available off-the-shelf as laminate.

The conductive adhesive with copper core is presently available off-the-shelf as tape with a thickness of approximately 80 μm.

Figure 4:
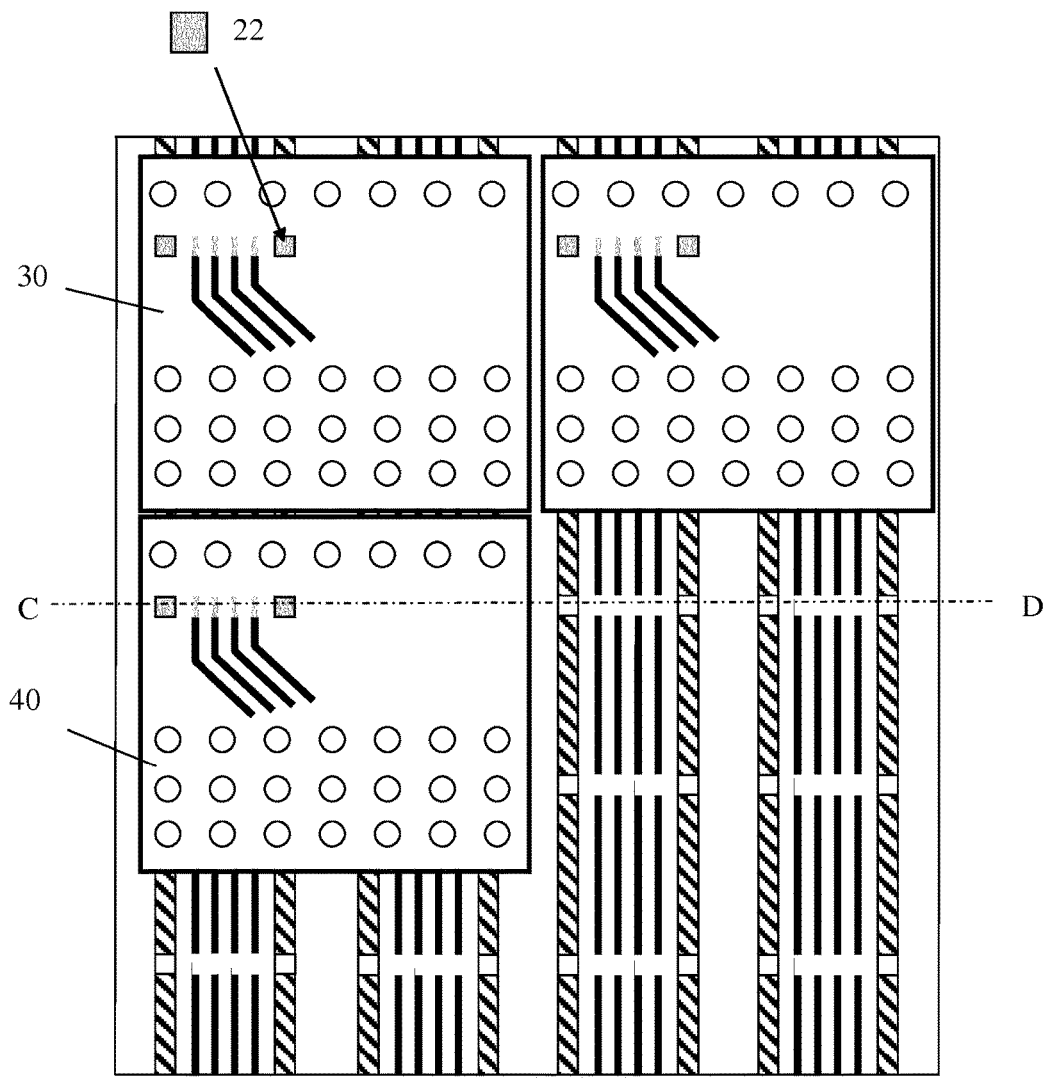
FIG. 4 illustrates an example of a tiled display.
Figure 5:
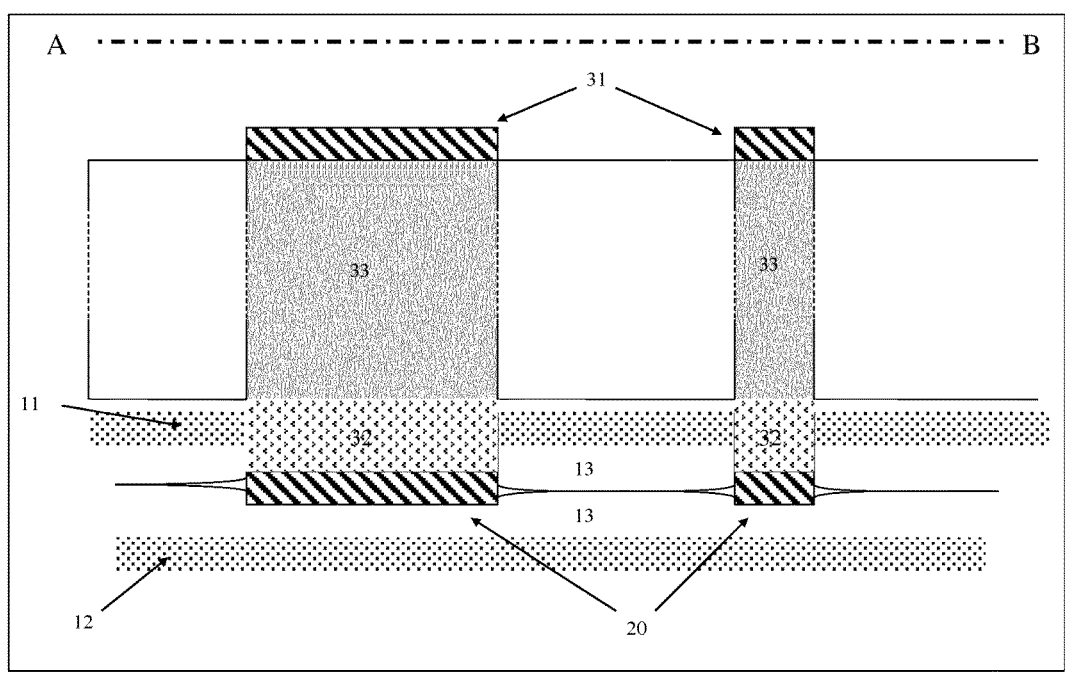
FIG. 5 represents a cross-section along axis CD as indicated in FIG. 4.

FIG. 4 shows an example of a tiled display. LED tiles 30 and 40 are assembled (e.g. glued) on the carrier substrate 10. The carrier 10 is easily obtained by cutting the required length of carrier from a roll of carrier described earlier.

The tiles 30 and 40 are printed circuit boards on which LED modules and the associated electronics are assembled on a first side of each tile (by gluing, soldering or any other adequate technique). The printed circuit boards are advantageously flexible printed circuit boards. Connections 22 between the circuit on tiles 30 and 40 and the tracks on the carrier are made with patterned self-adhesive conductive tape 32 on the second side of each tile.

The pattern of connections 22 on the self adhesive conductive tape on a second side of the tiles 30 and 40 matches the pattern of openings 21 on the carrier substrate 10.

Figure 6A:
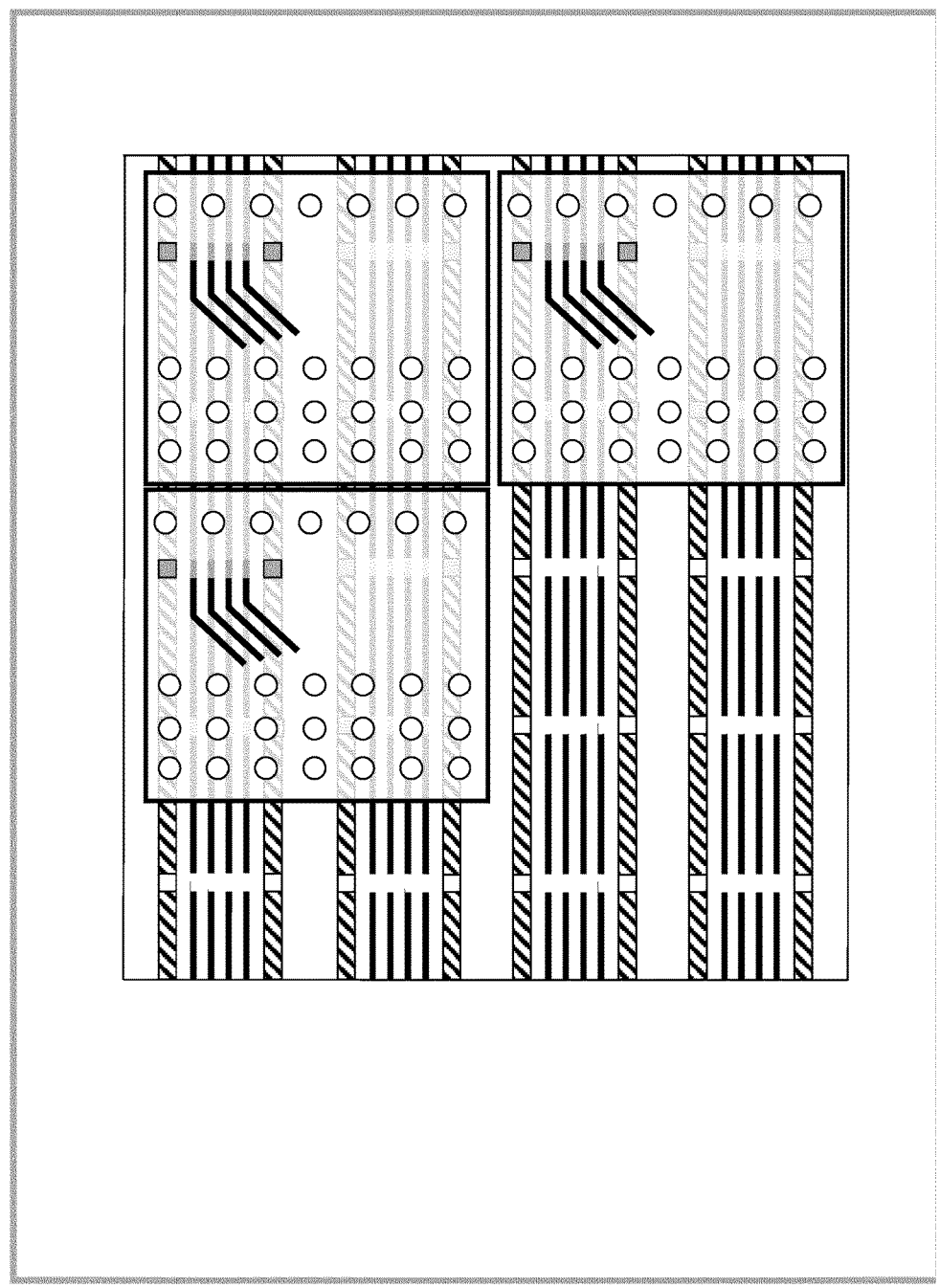
FIGS. 6a and 6b illustrate the use of a same carrier substrate to accommodate tiles of different dimensions.
Figure 6B:
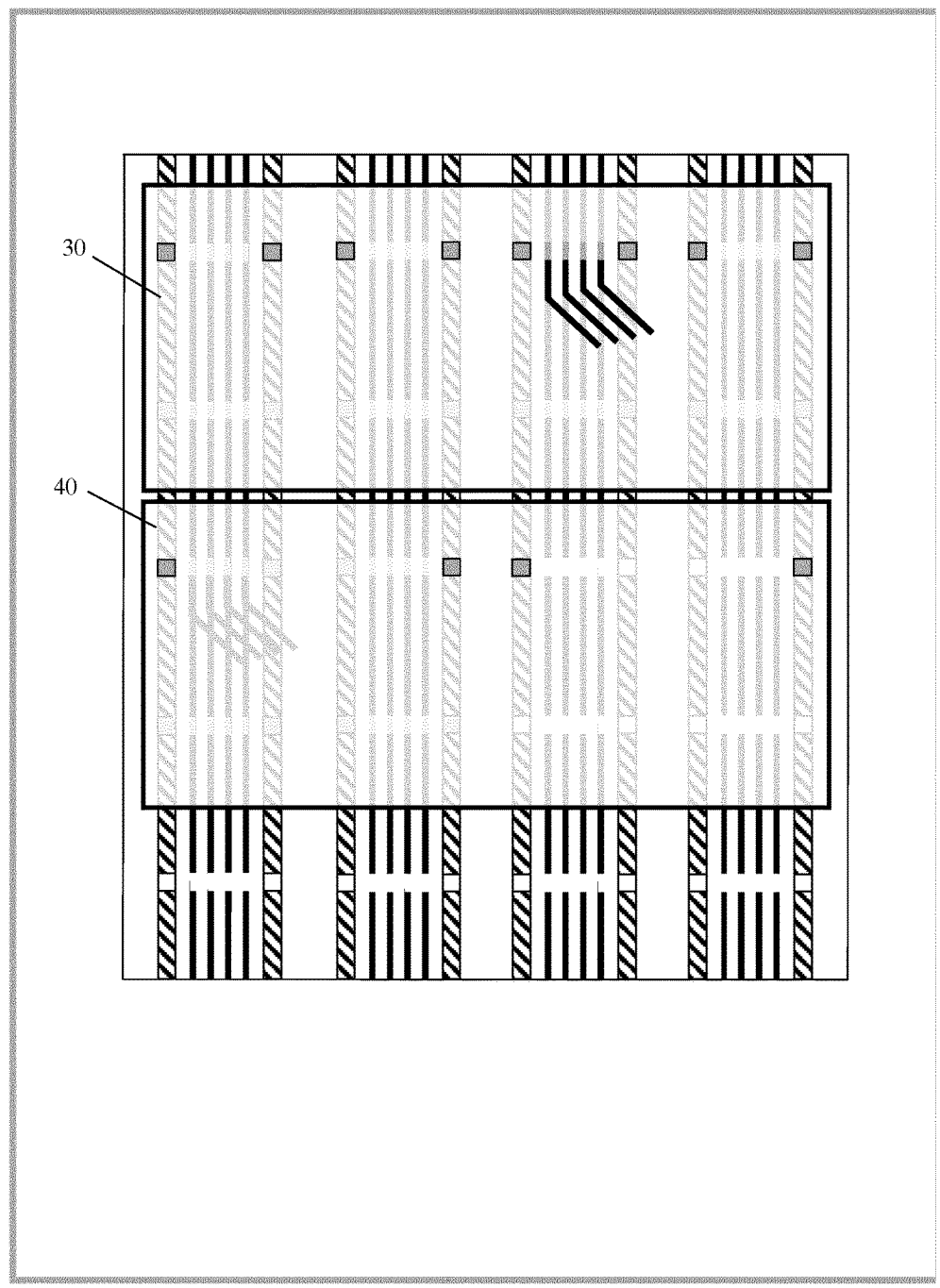

The periodicity with which the openings 21 are made in the carrier 10 enables to use the same carrier substrate with tiles of different dimensions in function of the application as exemplified on FIGS. 6a and 6b.

Adhesion between the carrier substrate and a tile need not be limited to the connections 22. A punch through sticker can e.g. pre-positioned on the back of a tile. Holes are punched in the sticker where connections 22 are expected. Assembly of the tiles onto the substrates then involves establishing adhesion of the aforementioned self-adhesive conductive tape as well as the punch-through sticker.

Figure 2C:
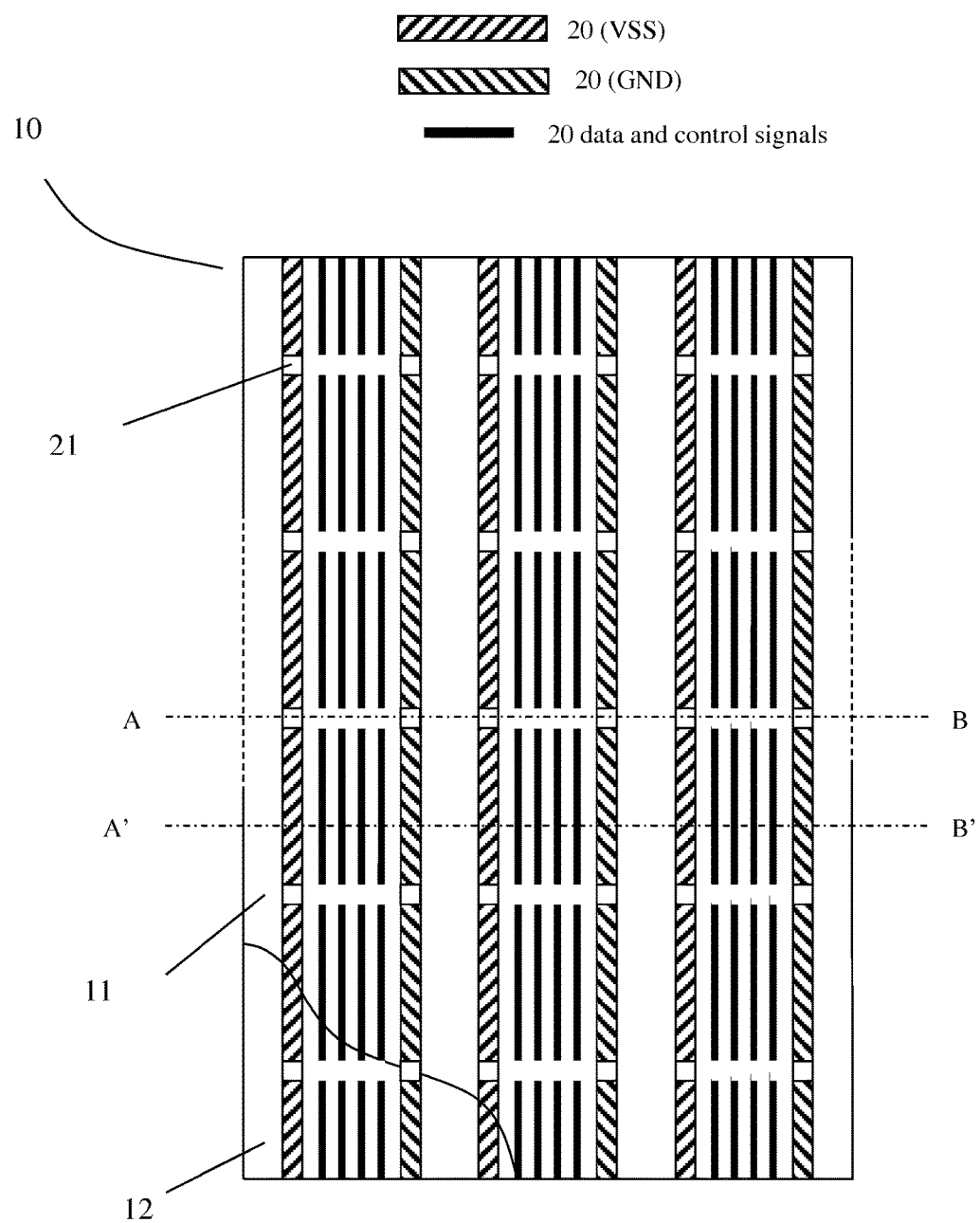

The data and control signal tracks on the carrier substrate 10 can be continuous as on FIG. 2b or interrupted at regular intervals as on FIG. 2c.

Continuous data and control signals tracks require that the tiles on the carrier be addressed in parallel (all tiles receive the signal at the same time).

Figure 6C:
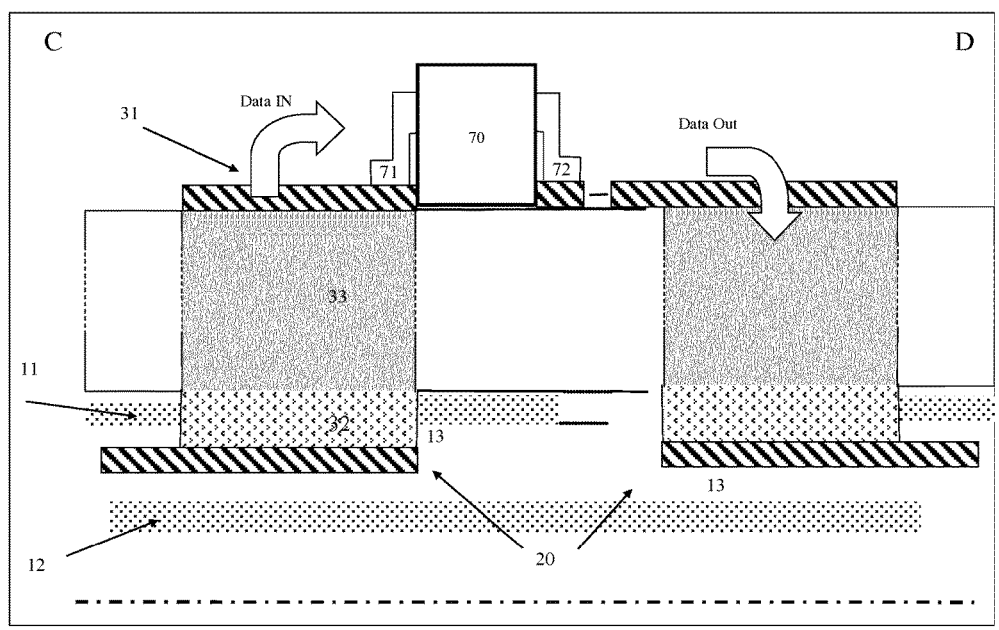
FIG. 6c illustrates the interruption of the tracks to daisy chain two tiles with respect to the command and/or the data signals.

When the data and control signal tracks are interrupted, the tiles are designed to transfer the data and control signals they receive to the next tile through the next portion of conducting tracks on the carrier. This is exemplified by FIG. 6c that gives a cross section along one of the data and control signal tracks. An example of daisy chained tiles in a tiled LED display is described in U.S. Pat. No. 7,071,620 "Display pixel module for use in a configurable large-screen display application and display with such pixel modules", assigned to the present applicant. As described in U.S. Pat. No. 7,071,620 and seen on FIG. 6c a resyncer unit 70 receives and re-transmits the serial video and serial control data directly from one LED module array 30 to a next LED module array 40 in a sequential string of LED module arrays 100. More specifically, the resyncer unit 70 receives a DATABUS IN signal, which is representative of serial video and serial control data, and transmits this data to the next device in sequence via a DATABUS OUT signal. A detailed example of the electronics that can be found on a tile 30 is also given in U.S. Pat. No. 7,071,620. The cited parts of U.S. Pat. No. 7,071,620 are incorporated herein by reference.

How the signals are transmitted by daisy chaining from one tile at the border of the display to the next tile of an adjacent tile column (tiles at top of FIGS. 6a and 6c) will be described further below.

Figure 7:
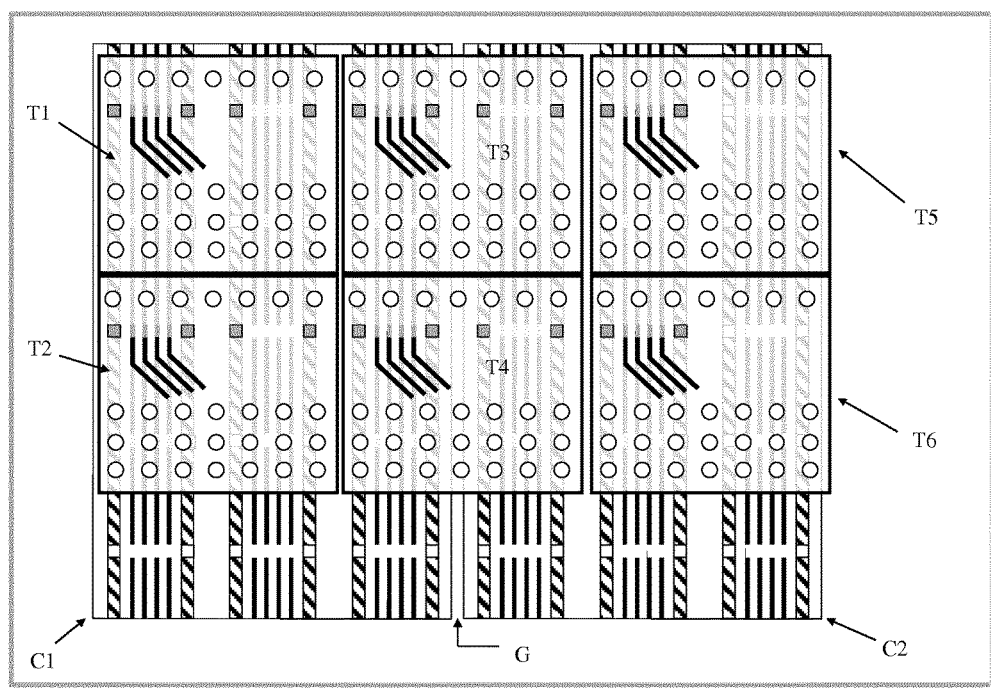
FIG. 7 illustrates an arrangement where tiles are used to fasten two adjacent carrier substrates together.

Repetition of the power, control and data signals bus on the carrier 10 offers the possibility of fastening two adjacent carrier substrates 10 by means of tiles overlapping and fastened to those two adjacent carriers. This possibility is illustrated on FIG. 6. In FIG. 7 two carriers C1 and C2 are placed parallel to each other. A gap G exists between the carriers C1 and C2. Tiles T1 and T2 are fastened and connected to the first carrier C1. Tiles T5 and T6 are fastened and connected to the second carrier C2. The tiles T3 and T4 overlap parts of the carriers C1 and C2. The tiles T3 and T4 are fastened and connected to both C1 and C2; thereby binding the two carriers together. The bridging of carrier substrates C1 and C2 by tiles T3 and T4 makes it possible to increase the robustness of the tiled display. If for instance, power was not distributed anymore by the conducting tracks on C1, bridges on T3 and T4 can bring power to the tiles T1 and T2 on C1 by connecting them to the conducting tracks on C2. The same can be done for the data and control signals, especially if the data and control signal tracks on the carriers are continuous and the tiles of the display are addressed in parallel.

Arbitrarily large displays tiles that can vary in dimensions from one display to the other may thus be assembled, while using the same format of carrier substrate 10.

Connection of the tracks (power, data and signal tracks) at a first end of a carrier track 10 to an external controller can be made by soldering the wires of a standard cable to the tracks 20 through the first set of openings 21.

Electrical connections of a carrier track to power and data signals can be done by spring contacts in a fashion similar to what can be done for electrical connections between the carrier substrate and a tile. Electrical connections of a carrier track to power and data signals can also be done by mean of a piercing connection i.e. a pin or needle in an electrically conducting material like copper or aluminum. By piercing a track, the needle will be in mechanical as well as electrical contact with that track.

Another solution is to use a clamping connector as now described.

The clamping connector 80 comprises two main parts 81 and 82. Parts 81 and 82 can be joined by a hinge but this is not strictly necessary. In their simplest form, 81 and 82 are two beams made of any suitable material and with dimensions sufficient to bear the weight of the flexible display 50. The two beams are preferably longer than the carrier substrate is wide and preferably as long as N times the width of a carrier substrate 10 (N being an integer larger or equal to 1) to enable assembly of displays with an arbitrary number M of carrier substrate 10 in parallel with 1≤M≤N.

A circuit 83 with at least one set of tracks 84 can be inserted between the beams 81 and 82. The ends of the tracks 84 have a pattern that corresponds to the pattern of openings 21 on the carrier substrate 10. The circuit 83 can be flexible and manufactured similarly to the carrier substrate 10. Openings 85 at the end of the tracks 84 give access to the conducting tracks 84. The tracks 20 on the carrier substrate 10 and the tracks 84 on the flexible circuit 83 can be connected e.g. with conductive glue, conductive tape or any other methods to bring the tracks in good electrical contact. This could be done e.g. by clamping the carrier substrate 10 and the flexible circuit 83 together by mean of the beams 81 and 82.

The beams 81 and 82 are held together with any practical means. In particular they can be held together with bolts and nuts, the bolts going through both beams 81 and 82. The openings for the bolts can be placed so that the bolts will pierce the carrier substrate 10. This can enhance the fixation of the carrier 10 to the connector clamp 80.

The circuit 83 is advantageously assembled to one of the beams 81 or 82. The tracks 84 are connected to one or more connectors 85 integral to the beam 81 or 82 to which the flexible circuit 83 is assembled to.

Pressure is applied to the stack consisting of beam 81, substrate carrier 10, flexible circuit 83 and beam 82 in a controlled manner by means of the bolts 86 and nuts 87 e.g. with a dynamometric torque wrench.

Connection of the display 50 to an external controller circuit and to a power supply or the local electrical network is then easily done with any type of cable corresponding to the one or more integral connectors 85.

Driver electronics to send or relay control and data signals to the display tiles and/or stabilized power supplies can be positioned in the clamp connector itself. There can be one driver units per set of tracks on a carrier substrate, one driver for one or more carrier substrate or a single driver for all of the carrier substrates.

A second clamp connector 90 can used at the second end of the carriers 10. Clamp connector 90 differ from the clamp connector 80 mainly by the layout of conductive tracks 94 on a flexible circuit 93 that will connect to the conductive tracks 20 on the carrier substrate 10. The tracks 94 can be adapted by e.g. a cutting operating of specific tracks 94 to tiles of different sizes. In its simplest form, the second clamp connector has no conductive tracks and acts only as ballast to keep the flexible displays under tension and avoid excessive displacement of the flexible display e.g. in the wind. In some instances the conducting tracks 94 are mere "jumpers" that connect two adjacent sets of tracks (on the same carrier substrate or on adjacent carrier substrates). When the tiles are operated in parallel, no tracks 94 are strictly necessary for the data and control signals.

The VSS and GND tracks on different substrate carriers 10 clamped by the clamp connector 90 are advantageously connected in parallel through the flexible circuit 93. This is expected to enhance the reliability of the system: should one or more of the power tracks on a carrier substrate 10 be damaged by e.g. sectioning of a conductive track, connection to the power tracks will be assured on both sides of the section thanks to the connections to the corresponding power tracks on the same carrier substrate 10 or on parallel carrier substrates of the display.

A clamp connector can be equipped with ball bearings 100 and 101 and e.g. a toothed wheel 102. Axles 103 and 104 part of a support structure 105 that can be fixed to a vertical surface 106 and the ball bearings fasten the clamp connector to the vertical surface 106. A mechanism 107 that can be part of the support structure 105 can turn the clamp connector e.g. through the toothed wheel 102 thereby enrolling or unrolling the tiled flexible display around the beams 81 and 82. Advantageously, beams 81 and 82 form a cylinder when assembled to ease rolling and unrolling of the flexible display. Rolling the flexible display at will can be advantageous to protect the flexible display when it is exposed to strong wind and/or rains.

The second and first connectors can also be used for mounting of the display to a vertical surface e.g. a wall. One of the connector can be fixed with reduced infrastructure to the wall, the other connector can be left hanging. The connector left hanging is weighed to provide tensioning to the flexible display thereby avoiding wild swings that can be caused by wind. The second connector can also be fixed to the wall just as the first one.

Interestingly, one of the connectors can be assembled to the flexible display in the factory and the display rolled around that connector before shipment. Once on site, the connector is fixed to the wall at both ends and is used as the drum of a pulley to unroll the display in a controlled manner. When the display must be disassembled, it is used as a pulley to roll back the display.

While the invention has been described hereinabove with reference to a number of embodiments, this is done to illustrate and not to limit the invention, the scope of which is determined by the accompanying claims. The skilled person will appreciate that features disclosed herein in connection with individual embodiments may be combined with features from other embodiments to obtain the same technical effects and advantages, without departing from the scope of the invention.

The invention claimed is:

1. A tiled display comprising discrete luminous sources distributed over at least two adjacent flexible display tiles, each of said flexible display tiles being configured to drive the discrete luminous sources on it when connected to a power supply and when receiving data and control signals, said data signals comprising a video signal; wherein the power, data and control signals are provided to the tiles through conducting tracks formed on a carrier substrate underlying said at least two display tiles, wherein an electrical connection between a first conductor on the carrier substrate and a second conductor on a tile is established by means of a connecting element comprising a resilient means keeping it pressed and in contact with a surface of the first conductor or second conductor.

2. The tiled display according to claim 1, wherein said resilient means comprises a body of compressible conductive material.

3. The tiled display according to claim 1, wherein said resilient means comprises a mechanism applying a force on a part of the connecting element and keeping said part in contact with said surface of the first conductor or the second conductor.

4. The tiled display according to claim 3, wherein the mechanism that presses a part of the connecting element comprises a spring.

5. The tiled display according to claim 3, wherein the mechanism that presses a part of the connecting element comprises a coil spring.

6. The tiled display according to claim 3, wherein the connecting element is a spring contact.

7. The tiled display according to claim 3 wherein the connecting element is a pogo pin.

8. The tiled display according to claim 1, wherein the connecting element is soldered to the first conductor on the carrier substrate and wherein, when in use, it presses itself or a part of the connecting element against a surface of the second conductor on the tile.

9. The tiled display according to claim 1, wherein the connecting element is soldered to the second conductor on the tile and wherein, when in use, it presses itself or a part of the connecting element against a surface of the first conductor on the carrier substrate.

* * * * *